(12) United States Patent
Cho

(10) Patent No.: US 11,379,172 B2
(45) Date of Patent: Jul. 5, 2022

(54) DISPLAY DEVICE INCLUDING A PLURALITY OF INSPECTION PADS

(71) Applicant: SAMSUNG DISPLAY CO., LTD., Yongin-si (KR)

(72) Inventor: Yeon Je Cho, Hwaseong-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 259 days.

(21) Appl. No.: 16/520,168

(22) Filed: Jul. 23, 2019

(65) Prior Publication Data

US 2020/0125314 A1    Apr. 23, 2020

(30) Foreign Application Priority Data

Oct. 17, 2018  (KR) .................. 10-2018-0123908

(51) Int. Cl.
| | |
|---|---|
| *G09G 5/00* | (2006.01) |
| *G06F 3/14* | (2006.01) |
| *G02F 1/1362* | (2006.01) |
| *H01L 49/02* | (2006.01) |
| *G09G 3/00* | (2006.01) |
| *H05K 1/02* | (2006.01) |

(52) U.S. Cl.
CPC ...... *G06F 3/1431* (2013.01); *G02F 1/136204* (2013.01); *G09G 3/006* (2013.01); *H01L 28/20* (2013.01); *H05K 1/0277* (2013.01)

(58) Field of Classification Search
CPC .......... G06F 3/1431; G06F 3/14; G06F 3/038; G02F 1/13; G02F 1/136204; G09G 3/006; G09G 5/00; H01L 28/20; H05K 1/0277
See application file for complete search history.

(56) References Cited

U.S. PATENT DOCUMENTS

| | | | |
|---|---|---|---|
| 5,936,687 | A | 8/1999 | Lee |
| 7,110,229 | B2 | 9/2006 | Yang et al. |
| 9,727,164 | B2 * | 8/2017 | Noto ................... G06F 3/04166 |
| 2005/0035718 | A1 * | 2/2005 | Lee ....................... G09G 3/3233 315/164 |
| 2015/0235913 | A1 * | 8/2015 | In ........................ H01L 27/1255 257/48 |
| 2017/0261542 | A1 * | 9/2017 | Onishi ................... G01R 27/02 |
| 2019/0288053 | A1 * | 9/2019 | Jung ..................... H01L 27/323 |

FOREIGN PATENT DOCUMENTS

| | | |
|---|---|---|
| KR | 10-0555301 | 3/2006 |
| KR | 10-0870663 | 11/2008 |
| KR | 10-2011-0054725 A | 5/2011 |
| KR | 10-2013-0051806 A | 5/2013 |

* cited by examiner

*Primary Examiner* — Pegeman Karimi

(74) *Attorney, Agent, or Firm* — Lewis Roca Rothgerber Christie LLP

(57) ABSTRACT

A display device according to an exemplary embodiment of the present invention includes: a substrate including a display area and a non-display area; a plurality of inspection pads in the non-display area; and a plurality of resistors, each located at an outermost edge of a respective inspection pad of the plurality of inspection pads, each of the resistors being located at a distance from the display area, the inspection pad located between the resistor and the display area, and the resistor located at the outermost edge of the non-display area.

16 Claims, 11 Drawing Sheets

DISPLAY DEVICE INCLUDING A PLURALITY OF INSPECTION PADS

CROSS-REFERENCE TO RELATED APPLICATION

This application claims priority to and the benefit of Korean Patent Application No. 10-2018-0123908, filed on Oct. 17, 2018 in the Korean Intellectual Property Office, the entire content of which is incorporated herein by reference.

BACKGROUND

1. Field

Aspects of embodiments of the present disclosure relate to a display device, and more particularly, it relates to a display device in which a resistor for preventing introduction of static electricity is disposed at an outermost edge of a pad for inspection.

2. Description of the Related Art

A display device may be classified into a liquid crystal display (LCD), an organic light emitting diode (OLED) display, a plasma display panel (PDP), and an electrophoretic display, depending on a light emission method.

A pixel in the OLED display includes two electrodes and an organic emission layer that is disposed between the two electrodes, and electrons injected from a cathode, which is one of the two electrodes, and holes injected from an anode, which is the other one of the two electrodes, are coupled in an organic emission layer such that excitons are formed, and light is emitted when the excitons emit energy.

Static electricity may be introduced into a display device from the outside, and a display element may be damaged due to the static electricity.

The above information disclosed in this Background section is only for enhancement of understanding of the background of the invention and, therefore, it may contain information that does not form the prior art that is already known in this country to a person of ordinary skill in the art.

SUMMARY

According to an aspect of embodiments of the present invention, a display device may be prevented from being damaged due to introduction of static electricity. According to an aspect of embodiments of the present invention, a display device in which a resistor for preventing or substantially preventing introduction of static electricity is disposed at an outermost edge of a pad for inspection is provided.

A display device according to one or more exemplary embodiments of the present invention includes: a substrate including a display area and a non-display area; a plurality of inspection pads in the non-display area; and a plurality of resistors, each located at an outermost edge of a respective inspection pad of the plurality of inspection pads, wherein each of the resistors is located at a distance from the display area, the inspection pad located between the resistor and the display area, and the resistor located at the outermost edge of the non-display area.

A resistor of the plurality of resistors may be located at each of the plurality of inspection pads.

The resistors may include polysilicon.

A resistor of the plurality of resistors may have a resistance of about 1 kΩ to about 4 kΩ.

The display device may further include a flexible printed circuit board arranged in the non-display area, and the inspection pads may be located at opposite sides of the flexible printed circuit board.

A display device according to one or more exemplary embodiments of the present invention includes: a substrate including a display area and a non-display area; and a plurality of inspection pads in the non-display area, wherein each of the plurality of inspection pads includes a plurality of horizontal portions that are distanced from each other and vertical portions connecting the horizontal portions, and the vertical portions are alternately arranged at opposite edges of the horizontal portions.

The plurality of horizontal portions and the vertical portions of the inspection pad may be connected as a single line, and may be formed in a shape of a rectangular plane.

The display device may include a plurality of resistors, each located at an outermost edge of a respective inspection pad of the plurality of inspection pads, and each of the resistors is located at a distance from the display area, the inspection pad located between the resistor and the display area, and the resistor located at the outermost edge of the non-display area.

The resistors may include polysilicon.

A resistor of the plurality of resistors may have a resistance of about 1 kΩ to about 4 kΩ.

A display device according to one or more exemplary embodiments of the present invention includes: a substrate including a display area and a non-display area; and a plurality of inspection pads in the non-display area, wherein each of the plurality of inspection pads includes a through plate area and a minute line area, the minute line area includes a plurality of horizontal portions that are distanced from each other and vertical portions connecting the horizontal portions, and the vertical portions are alternately arranged at opposite edges of the horizontal portions.

The through plate area may be located between the minute line area and the display area.

A probe for signal application may be configured to contact the through plate area.

The display device may include a plurality of resistors, each located at an edge of the minute line area, the resistor located at an outermost edge of a respective inspection pad of the plurality of inspection pads and at an outermost edge of the non-display area while being located at a distance from the display area, the inspection pad located between the resistor and the display area.

The resistors may include polysilicon.

A resistor of the plurality of resistors may have a resistance of about 1 kΩ to about 4 kΩ.

According to exemplary embodiments, a resistor is disposed at an outermost edge of an inspection pad in a display device such that the display device may be prevented from being damaged due to introduction of external static electricity.

DESCRIPTION OF SYMBOLS

Figure 1:
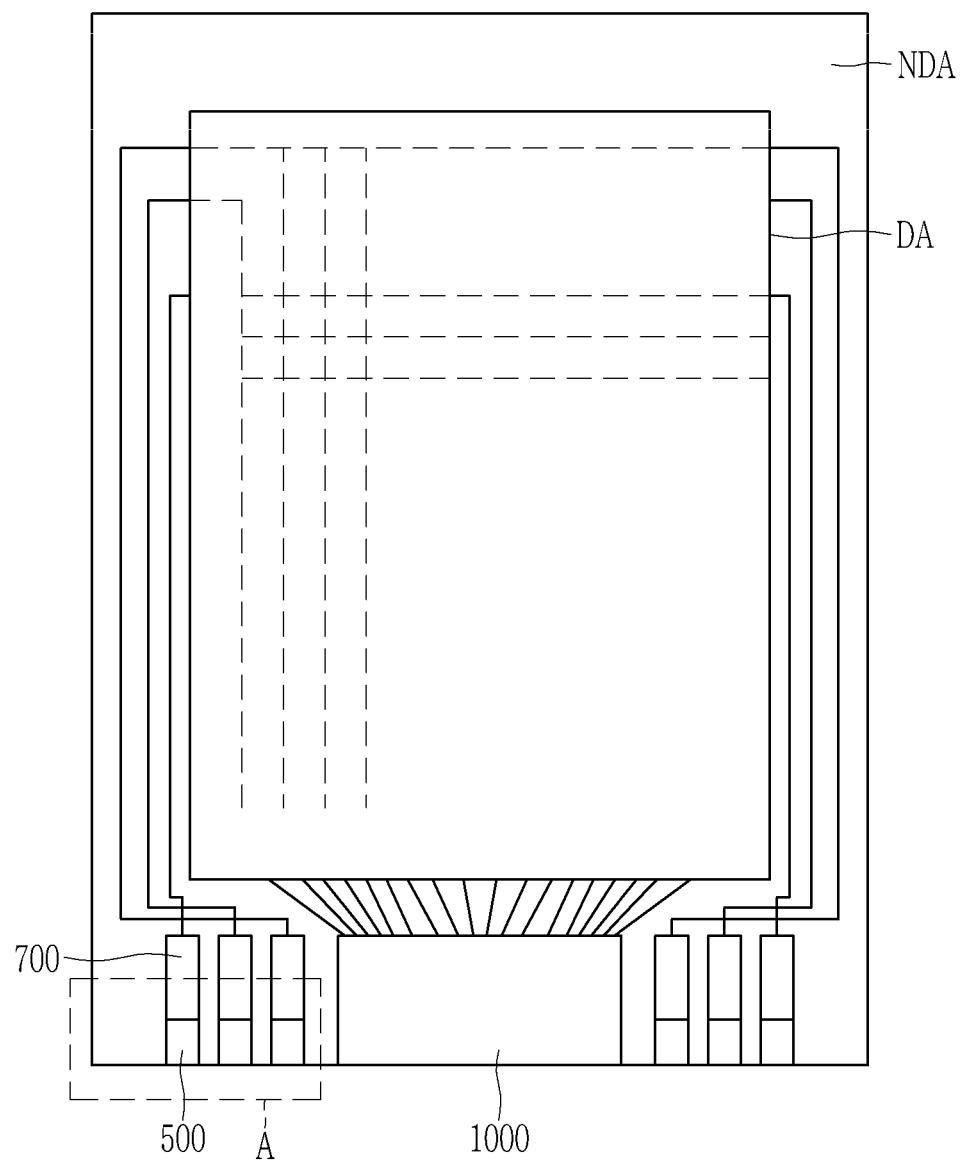
FIG. 1 schematically illustrates a display device according to an exemplary embodiment of the present invention.

| | |
|---|---|
| 100: first substrate | 110: first base substrate |
| 111: buffer layer | 121: gate line |
| 124: gate electrode | 140: gate insulation layer |
| 154: semiconductor layer | 160: interlayer insulation layer |
| 200: second substrate | 210: first base substrate |
| 220: light blocking member | 270: second electrode |
| DA: display area | NDA: non-display area |
| 700: inspection pad | 500: resistor |
| 701: through plate area | 702: minute line area |

DETAILED DESCRIPTION

Herein, some exemplary embodiments of the present invention will be described in more detail with reference to the accompanying drawings. As those skilled in the art would realize, the described embodiments may be modified in various different ways, all without departing from the spirit or scope of the present invention.

The drawings and description are to be regarded as illustrative in nature and not restrictive. Like reference numerals designate like elements throughout the specification.

In addition, the size and thickness of each configuration shown in the drawings may be arbitrarily shown for better understanding and ease of description, but the present invention is not limited thereto. In the drawings, the thickness of layers, films, panels, regions, etc., may be exaggerated for clarity.

It is to be understood that when an element, such as a layer, film, region, or substrate, is referred to as being "on" another element, it may be directly on the other element or one or more intervening elements may also be present. In contrast, when an element is referred to as being "directly on" another element, there are no intervening elements present. The word "on" or "above" means positioned on, above, or below the object portion, and does not necessarily mean positioned on the upper side of the object portion based on a gravitational direction.

In addition, unless explicitly described to the contrary, the word "comprise" and variations such as "comprises" or "comprising" are to be understood to imply the inclusion of stated elements but not the exclusion of any other elements.

In addition, in this specification, the phrase "on a plane" means viewing a target portion from the top, and the phrase "on a cross-section" means viewing a cross-section formed by vertically cutting a target portion from the side.

Unless otherwise defined, all terms (including technical and scientific terms) used herein have the same meaning as commonly understood by one of ordinary skill in the art to which example embodiments of the inventive concept belong. It is to be further understood that terms, such as those defined in commonly-used dictionaries, should be interpreted as having a meaning that is consistent with their meaning in the context of the relevant art and will not be interpreted in an idealized or overly formal sense unless expressly so defined herein.

Herein, a display device according to an exemplary embodiment of the present invention will be described in further detail with reference to the accompanying drawings.

Figure 2:
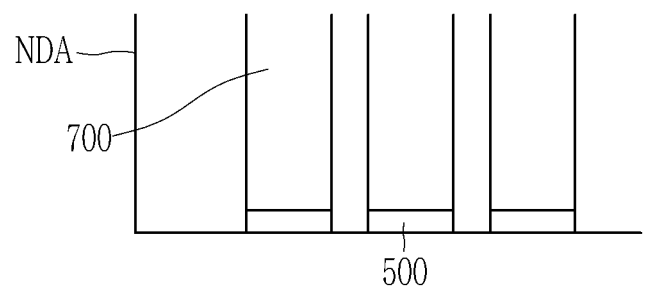
FIG. 2 shows a region "A" in FIG. 1.

FIG. 1 schematically illustrates a display device according to an exemplary embodiment of the present invention; and FIG. 2 illustrates a region "A" in FIG. 1. Referring to FIG. 1 and FIG. 2, a display device according to an exemplary embodiment of the present invention includes a display area DA and a non-display area NDA, and includes a plurality of pads for inspection (herein referred to as inspection pads) 700 disposed in the non-display area NDA, and resistors 500 that are disposed at outermost edges of the respective inspection pads 700.

A resistor 500 is disposed at an edge of each inspection pad 700, i.e., an edge of the non-display area NDA, to prevent or substantially prevent introduction of static electricity into the display area DA. In the present exemplary embodiment, the resistors 500 are disposed adjacent to the outermost edge of the non-display area NDA. Thus, a signal for inspection, applied to the inspection pad 700 through a probe and the like may be transmitted to the display area DA without passing through the resistor 500. However, static electricity introduced from the outside is introduced through the edges of the non-display area NDA, and, accordingly, the external static electricity can be blocked by the resistors 500.

In an embodiment, the resistors 500 may be formed of a polysilicon. However, this is merely an example, and a specific material that forms the resistor 500 is not limited thereto. In an embodiment, the resistor 500 may have resistance of about 1 kΩ to about 4 kΩ.

The inspection pads 700 are pads provided for lighting inspection of the display area DA, and determine whether the display device normally operates by applying a signal to the inspection pad 700 after manufacturing of the display device. Such an inspection pad 700 is exposed even after a module of the display device is manufactured. In FIG. 1, only some of the plurality of inspection pads 700 are illustrated for convenience of description, but 20 or more inspection pads 700 may be provided in the display device. For example, various signals such as a CLK signal, a Vint signal, a VGL signal, a VGH signal, a gate signal, a data signal, and the like are transmitted through the inspection pads 700, and the respectively signals may be transmitted through the respective pads 700.

Referring to FIG. 1, the inspection pads 700 may be disposed at opposite sides, disposing a FPCB pad portion 1000 therebetween. However, this is an example, and locations of the inspection pads 700 are not limited to the locations shown in FIG. 1.

In FIG. 1, the FPCB pad portion 1000 may be connected with a flexible printed circuit (FPC) or a COP. That is, in FIG. 1, the FPCB pad portion 1000 is an area that contacts or is connected with the printed circuit board or the COP. The flexible printed circuit may include a gate driver or a data driver.

The inspection pad 700 is provided for lighting inspection at a cell stage before the FPCB is attached during a manufacturing process of the display device. Thus, as shown in FIG. 1, the inspection pad 700 is not connected with the FPCB but is connected with the display area DA.

Referring to FIG. 1, a data line, a gate line, and the like in the display area DA are connected as a single wire such that they are connected with the inspection pads 700 of the non-display area NDA. That is, the gate line of the display area DA is connected with a gate line inspection pad among the inspection pads 700, and the data line of the display area DA is connected with a data line inspection pad among the inspection pads 700.

Thus, the inspection pads 700 can determine whether the display device normally operate before the FPCB is attached during the manufacturing process of the display device.

Figure 3:
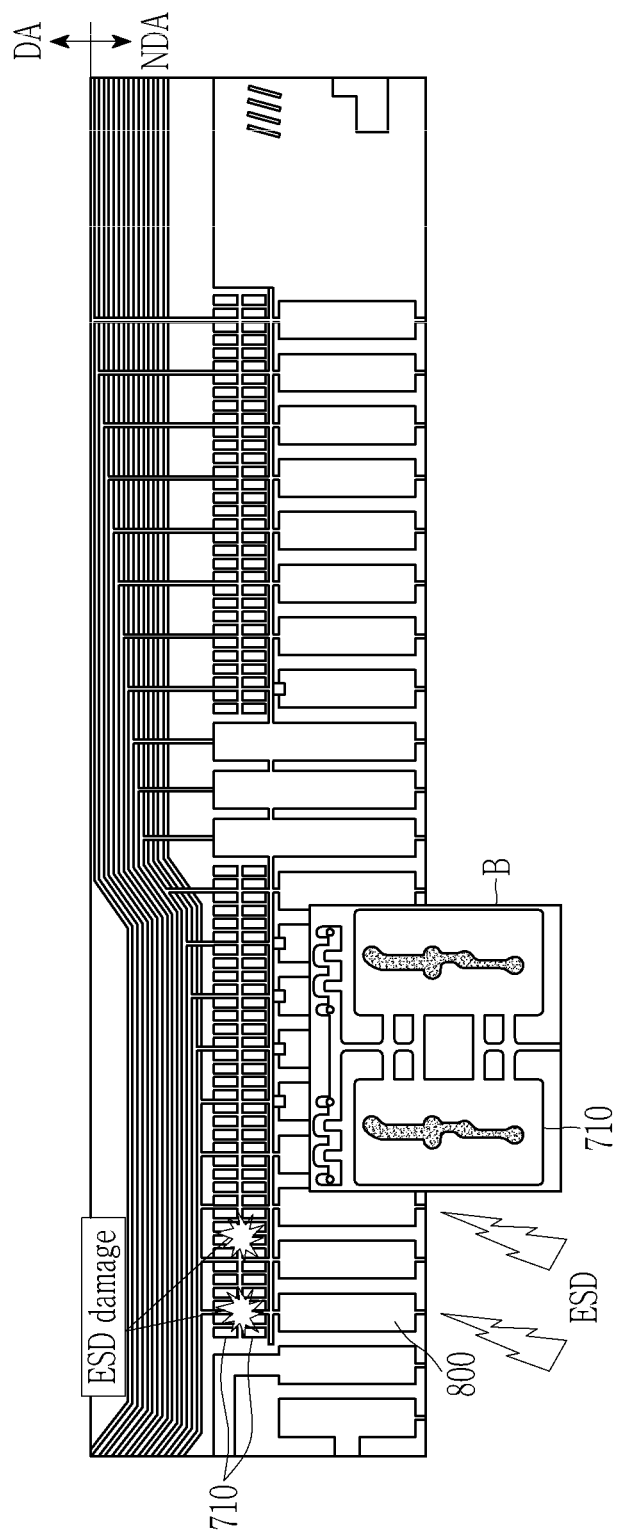
FIG. 3 illustrates a portion of a display device according to a comparative example.

FIG. 3 shows inspection pads 800 of a display device according to a comparative example. Referring to FIG. 3, static electricity ESD is introduced through edges of the inspection pads 800, exposed to the outside. The introduced static electricity may cause damage to an organic light emitting diode 710 connected with the inspection pad 800. In FIG. 3, a region "B" is an enlarged view of a damaged diode 710. Referring to FIG. 3, a damaged area is darkened. In addition, although it is not illustrated in FIG. 3, static electricity introduced into the display area DA may cause damage to an organic light emitting element.

That is, as can be determined through FIG. 3, the inspection pads 800 are exposed to the outside even after the display device is modularized, thereby causing introduction of static electricity, and the introduced static electricity causes damage to the display device.

However, as shown in FIG. 1 and FIG. 2, the resistors 500 are disposed at the outermost edges of the inspection pads 700 in the display device according to an exemplary embodiment of the present invention. Thus, introduction of external static electricity can be blocked by the resistors 500, and, accordingly, damage to the display device due to static electricity may be prevented.

In addition, since the resistors 500 are disposed at the outermost edges of the inspection pads 700, an RC delay due to the resistors 500 during operation of the inspection pads 700 may be prevented.

Figure 4:
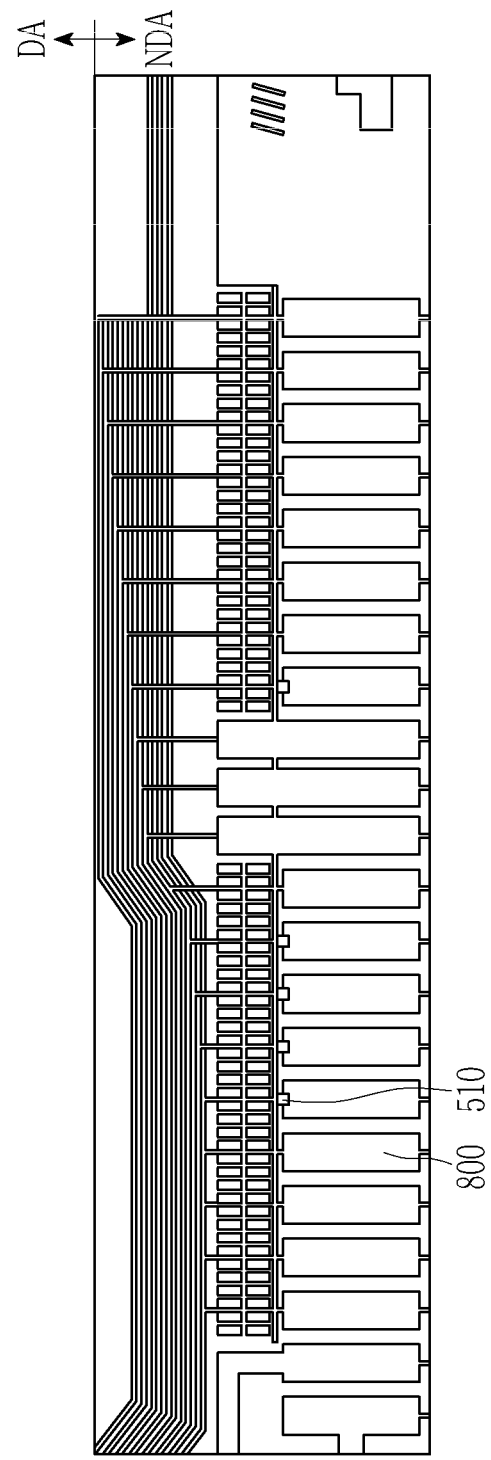
FIG. 4 shows inspection pads of a display device according to a comparative example.

FIG. 4 shows inspection pads of the display device according to a comparative example. Referring to FIG. 4, resistors 510 are disposed only in some of a plurality of inspection pads 800. In addition, the resistors 510 are disposed at an edge of each inspection pad 800 which is close to edges of the display area DA. That is, in the comparative example, the resistor 510 is disposed on a path through which a signal applied to the inspection pad 800 is transmitted.

Some of the plurality of inspection pads 800 may be pads to which a high-speed signal such as a CLK signal is transmitted. When a resistor is disposed between such an inspection pad 800 and the display area DA, an RC delay may occur, thereby causing deterioration of a characteristic of the display device. Thus, in the case of the display device according to the comparative example, as shown in FIG. 4, the resistors 510 are disposed only in some of the plurality of inspection pads 800. That is, the resistor 510 can be disposed only in an inspection pad 800 where a signal delay does not cause a problem. Accordingly, the resistors 510 may not be provided in some of the inspection pads 800, and static electricity may be introduced through the inspection pads 800 where the resistors 510 are not provided.

However, in the display device according to the present exemplary embodiment, the resistors 500 are disposed at the outermost edges of the inspection pads 700 such that the resistors 500 are provided in all of the inspection pads 700. That is, since a resistor is not disposed on a path through which a signal applied to the inspection pad 700 is transmitted, externally introduced static electrically can be effectively blocked without causing a signal delay.

Figure 5:
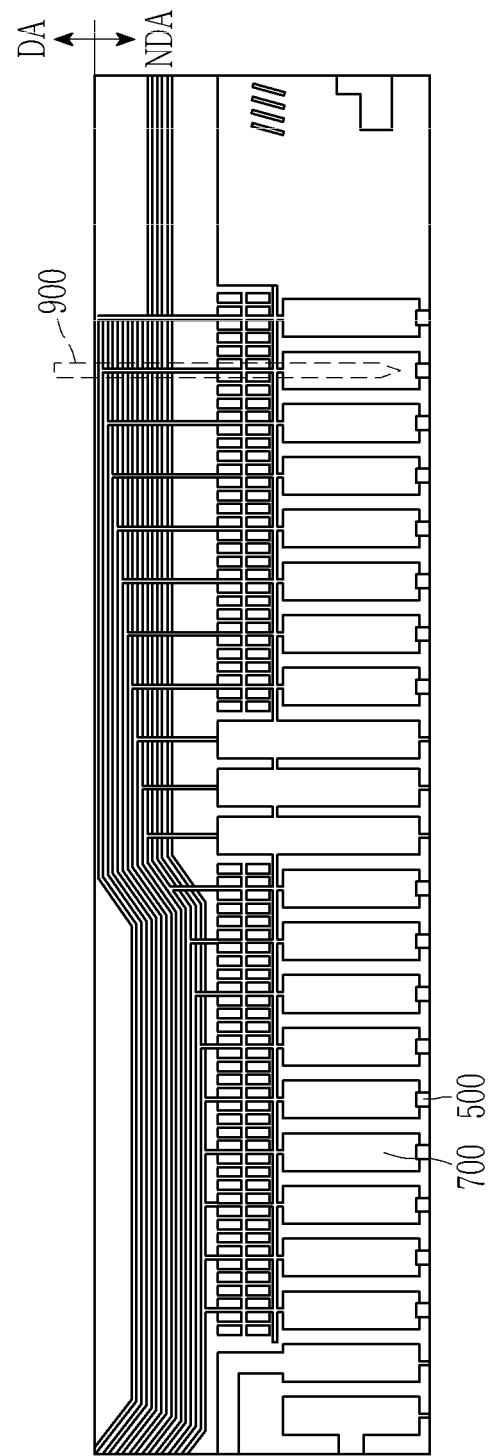
FIG. 5 shows inspection pads of a display device according to an embodiment of the present invention.

FIG. 5 shows the inspection pad of the display device according to the present exemplary embodiment. Referring to FIG. 5, the resistors 500 are disposed at the outermost edges of the inspection pads 700. Thus, externally introduced static electricity can be effectively blocked.

Signal application to the inspection pad 700 can be carried out by contacting a probe to a center of each of the inspection pads 700. A probe 900 is exemplarily illustrated in FIG. 5. That is, the probe 900 contacts the center of the inspection pad 700 such that a signal is applied to the display area DA. In the display device according to the present exemplary embodiment, the resistor 500 is disposed at the outermost edge of the inspection pad 700, and, thus, the resistor 500 is not disposed on a path through which a signal applied from the probe 900 is transmitted. Accordingly, an RC delay due to the resistor 500 may be prevented. Since no signal delay due to the resistor 500 occurs, resistors 500 can be provided in all of the inspection pads 700, and, accordingly, static electricity can be effectively blocked.

Figure 6:
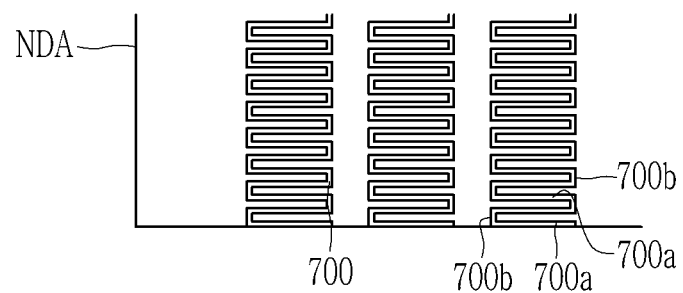
FIG. 6 shows an area corresponding to the area shown in FIG. 2, in a display device according to another exemplary embodiment of the present invention.

Next, a display device according to another exemplary embodiment of the present invention will be described. FIG. 6 shows an area corresponding to the area shown in FIG. 2, in a display device according to another exemplary embodiment of the present invention.

Referring to FIG. 6, an inspection pad 700 according to an exemplary embodiment of the present invention has a shape in which a minute line is repeatedly zigzagged instead of having a shape of a through plate. Specifically, referring to FIG. 6, the inspection pad 700 includes a plurality of horizontal portions 700a and a plurality of vertical portions 700b that connect the horizontal portions 700a. Each vertical portion 700b is disposed only at one edge, or side, of neighboring horizontal portions 700a, and is not disposed at the other edge, or side. That is, the vertical portions 700b are alternately disposed at opposite edges, or sides, of the horizontal portions 700a to connect the horizontal portions 700a. Thus, the inspection pad 700 has a shape in which one connected line is iteratively extended left and right.

That is, a path through which a signal is transmitted is longer in the inspection pad 700 of FIG. 6 than in a through plate. Since resistance is proportional to the length of a conductor, the inspection pad 700 functions as a resistor as a path through which a signal is transmitted is extended. Accordingly, external static electricity can be blocked without using an additional resistor. Thus, a process can be economical and a structure can be simplified.

Figure 7:
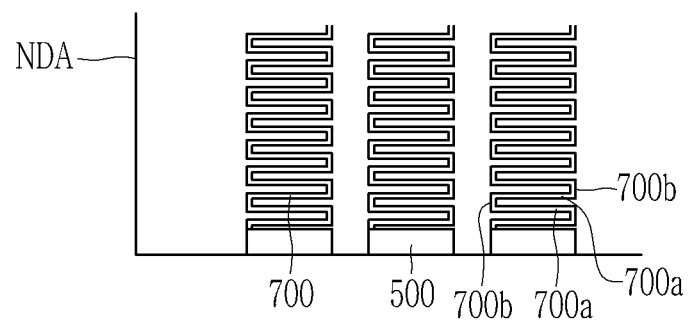
FIG. 7 shows an area corresponding to the area shown in FIG. 2, in a display device according to another exemplary embodiment of the present invention.

FIG. 7 shows an area corresponding to the area shown in FIG. 2, in a display device according to another exemplary embodiment of the present invention. Referring to FIG. 7, a display device according to the present exemplary embodiment is similar to the display device according to the exemplary embodiment of FIG. 6, except that resistors 500 are disposed at one edge of inspection pads 700. Further detailed description of the same components will be omitted.

In a display device according to the exemplary embodiment of FIG. 7, an inspection pad 700 is formed in a shape of which a minute line is iteratively zigzagged rather than provided as a through plate, and a resistor 500 is disposed at the outermost edge of the inspection pad 700. Thus, external static electricity is blocked first by the resistor 500 and then blocked again by the inspection pad 700 because the inspection pad 700 itself functions as a resistor. Accordingly, introduction of static electricity into a display area DA can be more effectively prevented. That is, in the display device according to the present exemplary embodiment, static electricity is blocked primarily by the resistor 500 and then secondarily blocked by the inspection pad 700, and, accordingly, introduction of static electricity may be effectively prevented.

Figure 8:
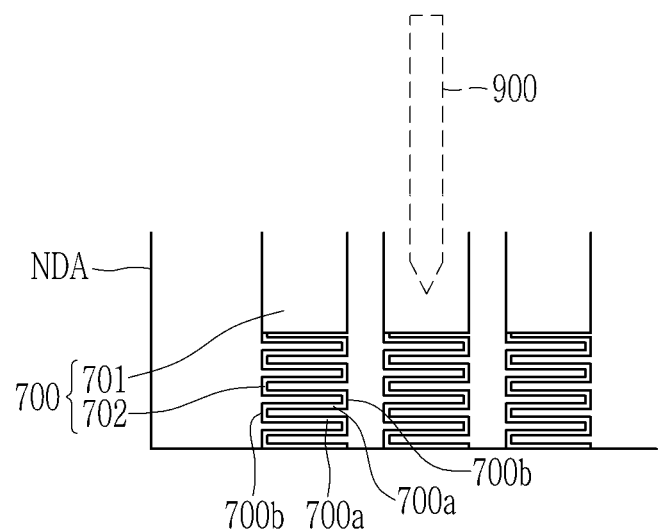
FIG. 8 shows the same area as the area shown in FIG. 2, in a display device according to another exemplary embodiment of the present invention.

FIG. 8 shows an area corresponding to the area shown in FIG. 2, in a display device according to another exemplary embodiment of the present invention. A display device of FIG. 8 is the same as the display device of FIG. 6, except that an inspection pad 700 includes a through plate area 701 and a minute line area 702. Further detailed description of the same constituent elements is omitted. Referring to FIG. 8, in the display device according to the present exemplary embodiment, the inspection pad 700 includes the through plate area 701 and the minute line area 702.

In the display device according to the exemplary embodiment of FIG. 8, the inspection pad 700 is partially the through plate area 701 and partially the minute line area 702. The through plate area 701 is disposed close to a display area, and the minute line area 702 is disposed adjacent to an edge of a non-display area NDA. That is, the through plate area 701 is disposed between the minute line area 702 and the display area DA.

A probe 900 for signal application to the inspection pad 700 contacts the through plate area 701. Thus, a signal transmitted to the display area DA can be transmitted to the display are DA without experiencing delay due to resistance. Accordingly, signal delay, which occurs while the signal passes through the minute line area 702, may be prevented, and, in an exemplary embodiment, the signal is transmitted along a short path.

In FIG. 8, externally introduced static electricity must pass through the minute line area 702. However, since a long minute line area 702 itself functions as a resistor, introduction of static electricity to the display area DA can be effectively blocked.

That is, in the display device according to the present exemplary embodiment, a signal can be transmitted to the display area DA without having a delay, and, at the same time, introduction of external static electricity can be effectively blocked.

Figure 9:
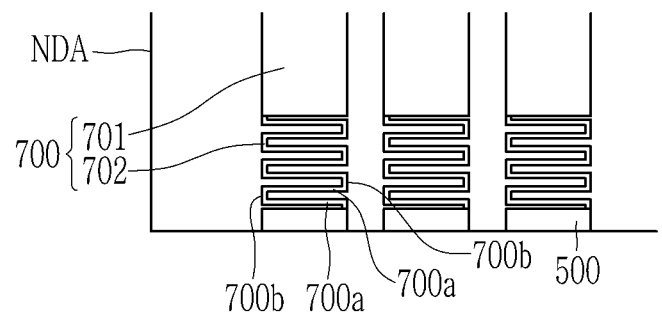
FIG. 9 shows an area corresponding to the area shown in FIG. 2, in a display device according to another exemplary embodiment of the present invention.

FIG. 9 shows a display device according to another exemplary embodiment of the present invention. A display device of an exemplary embodiment of FIG. 9 is the same as the display device according to the exemplary embodiment of FIG. 8, except that a resistor 500 is disposed at an edge of an inspection pad 700. Further detailed description of the same constituent elements is omitted.

That is, in the display device according to the exemplary embodiment of FIG. 9, the inspection pad 700 includes a through plate area 701 and a minute line area 702, and the resistor 500 is disposed at an edge of the minute line area 702.

In the exemplary embodiment of FIG. 9, the resistor 500 is further included compared to the exemplary embodiment of FIG. 8, and, thus, introduction of external static electricity may be more effectively prevented. That is, a signal can be transmitted to a display area DA without delay through the through plate area 701 of the inspection pad 700, and introduction of external static electricity can be effectively blocked through the minute line area 702 of the inspection pad 700 and the resistor 500.

Figure 10:
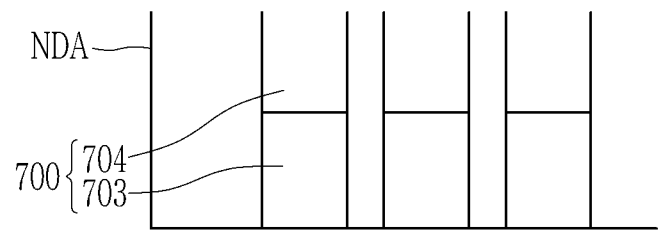
FIG. 10 shows an area corresponding to the area shown in FIG. 2, in a display device according to another exemplary embodiment of the present invention.

FIG. 10 shows an area corresponding to the area shown in FIG. 2 in a display device according to another exemplary embodiment of the present invention. Referring to FIG. 10, in a display device according to the present exemplary embodiment, an inspection pad 700 includes a first area 703 and a second area 704, and the first area 703 is disposed adjacent to an edge of the display device. That is, the second area 704 is disposed between the first area 703 and a display area (not shown).

Resistance of the first area 703 is higher than that of the second area 704. In an exemplary embodiment of FIG. 10, the inspection pad 700 is formed of materials each having a different resistance, and, thus, each area of the inspection pad 700 has a different resistance. In an embodiment, the first area 703 may have resistance of about 1 kΩ to about 4 kΩ.

As described, in an embodiment, the inspection pad 700 has a different resistance in each area, and introduction of external static electricity can be effectively blocked as the first region 703 disposed at the edge of the inspection pad 700 has a higher resistance.

Figure 11:
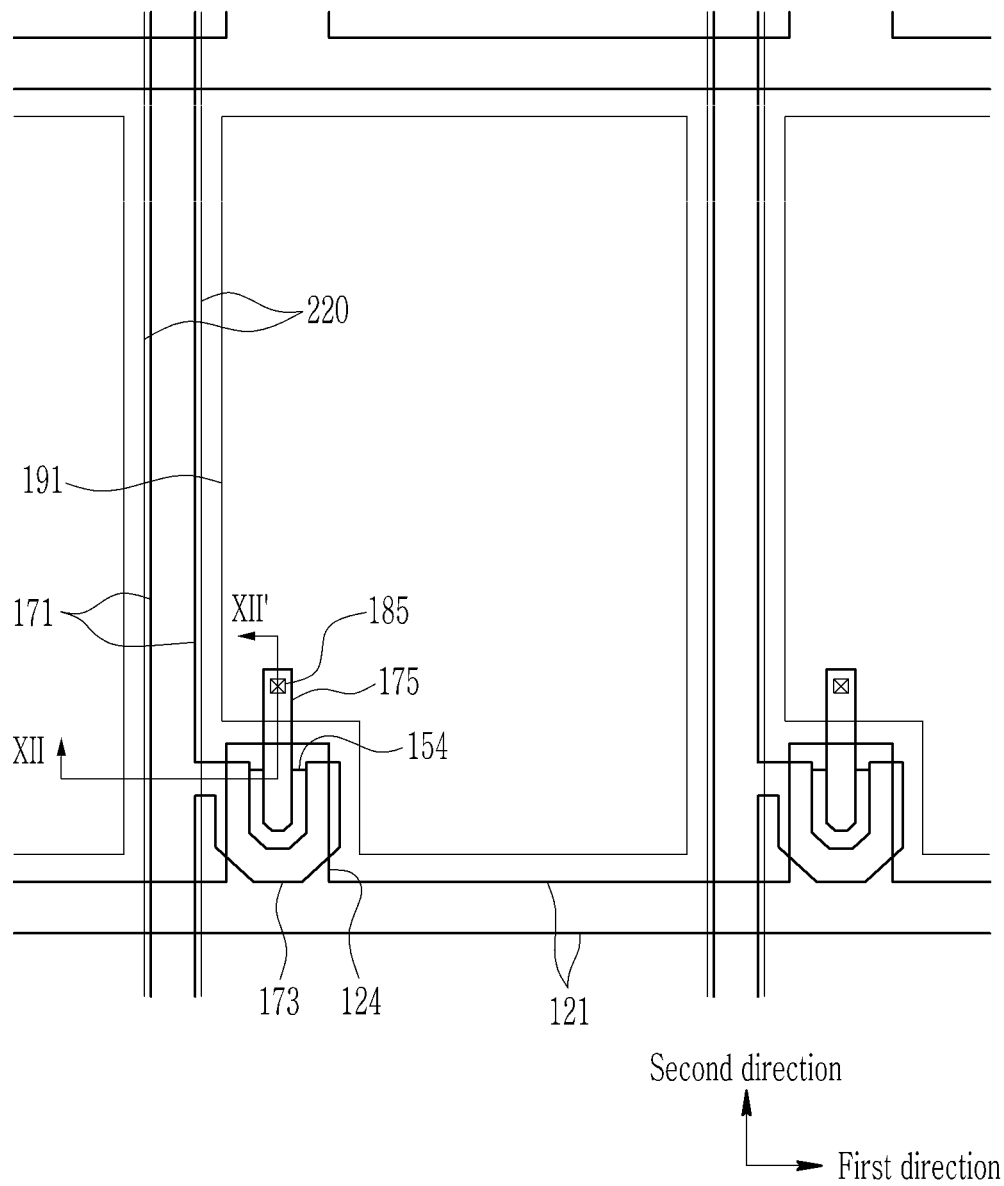
FIG. 11 is a partial layout view of a display device according to an exemplary embodiment of the present invention.

Next, a pixel structure in a display device of a display device according to an exemplary embodiment of the present invention will be described in further detail with reference to the accompanying drawings. FIG. 11 is a partial layout view of a display device according to an exemplary embodiment of the present invention; and FIG. 12 is a cross-sectional view of the display device of FIG. 11, taken along the line XII-XII'.

Figure 12:
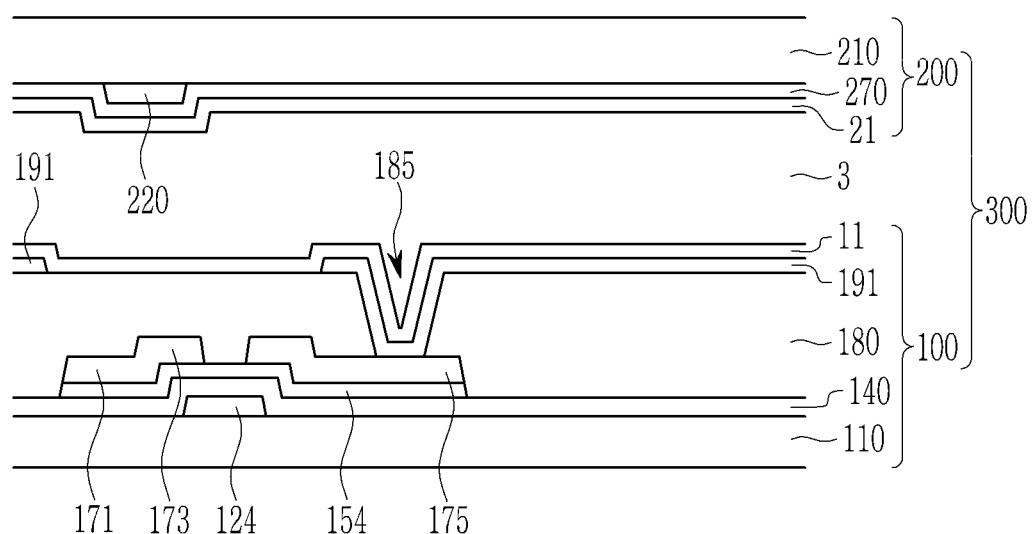
FIG. 12 is a cross-sectional view of the display device of FIG. 11, taken along the line XII-XII'.

Referring to FIG. 11 and FIG. 12, a display panel 300 includes a first substrate 100, a second substrate 200 that overlaps the first substrate 100, and a liquid crystal layer 3 disposed between the first substrate 100 and the second substrate 200.

The first substrate 100 will now be described. A gate conductor that includes gate lines 121 and a gate electrode 124 is disposed on one side of a first base substrate 110 that is made of transparent glass or plastic.

The gate line 121 may extend in a first direction. The gate conductor may include any of various metals or conductors, and may have a multi-layered structure. A gate insulation layer 140 is disposed between the gate conductor and the liquid crystal layer 3. The gate insulation layer 140 may include an inorganic insulating material.

A semiconductor layer 154 is disposed on one side of the gate insulation layer 140.

A data line 171 is disposed between the semiconductor layer 154 and the liquid crystal layer 3, and extends in a second direction and thus crosses the gate line 121. A source electrode 173 extends from the data line 171 and thus may overlap the gate electrode 124. A drain electrode 175 is separated from the data line 171, and, as shown in FIG. 11, may be formed in the shape of a bar extending toward a center of the source electrode 173.

A part of the semiconductor layer 154 may not overlap the data line 171 and the drain electrode 175 in an area between the source electrode 173 and the drain electrode 175. Excluding such an un-overlapped portion, the semiconductor layer 154 may substantially have the same planar shape as the data line 171 and the drain electrode 175.

One gate electrode 124, one source electrode 173, and one drain electrode 175 form one thin film transistor together with the semiconductor layer 154, and a channel of the thin film transistor is an area of the semiconductor layer 154 between the source electrode 173 and the drain electrode 175.

A passivation layer 180 is disposed between the source electrode 173, the drain electrode 175, and the liquid crystal layer 3. The passivation layer 180 may include an inorganic insulation material, such as any of a silicon nitride and a silicon oxide, an organic insulation material, a low dielectric constant insulating material, and the like.

The passivation layer 180 includes a contact hole 185 that overlaps a part of the drain electrode 175.

A first electrode 191 is disposed between the passivation layer 180 and the liquid crystal layer 3. The first electrode 191 is physically and electrically connected with the drain electrode 175 through the contact hole 185, and receives a data voltage from the drain electrode 175. The first electrode 191 may be a pixel electrode.

A first alignment layer 11 is disposed between the first electrode 191 and the liquid crystal layer 3.

The second substrate 200 includes a second base substrate 210, a light blocking member 220, a second electrode 270, and a second alignment layer 21.

The second electrode 270 is disposed at one side of the second base substrate 210. The second electrode 270 may be a common electrode.

The light blocking member 220 is disposed between the second base substrate 210 and the second electrode 270. The light blocking member 220 may extend in the second direction while overlapping the data line 171. Although it is not illustrated, the light blocking member 220 may further include a horizontal portion that extends in the first direction while overlapping the gate line 121. However, in another embodiment, the light blocking member 220 may be omitted. The second alignment layer 21 is disposed between the second electrode 270 and the liquid crystal layer 3.

The above-described structure is merely an example, and the structure of the display device is not limited to that shown in FIG. 11 and FIG. 12.

Figure 13:
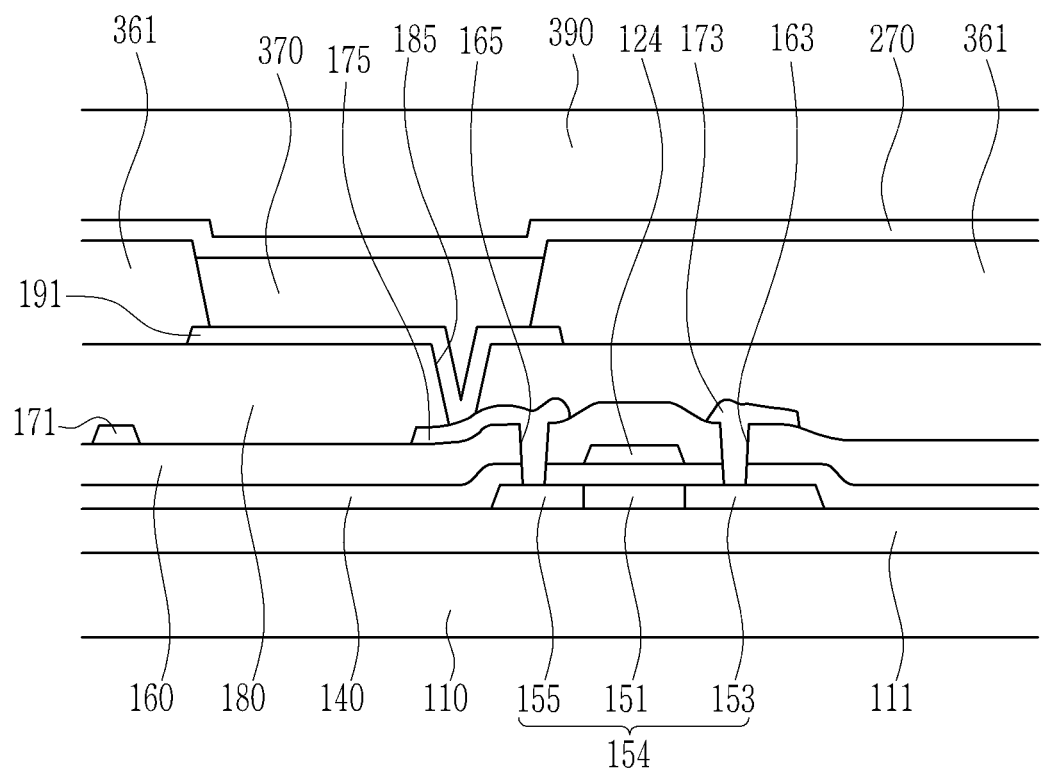
FIG. 13 is a cross-sectional view of a display device according to an exemplary embodiment of the present invention.

Next, a pixel structure of a display area according to another exemplary embodiment of the present invention will be described in further detail with reference to FIG. 13. FIG. 13 is a cross-sectional view of a display device according to an exemplary embodiment of the present invention.

Referring to FIG. 13, a buffer layer 111 that is made of a silicon oxide or a silicon nitride is disposed on a first base substrate 110.

A semiconductor layer 154 is disposed on the buffer layer 111. The semiconductor layer 154 includes a source area 153 and a drain area 155, which are doped with a p-type impurity, and a channel area 151 that is disposed between the source area 153 and the drain area 155.

A gate insulation layer 140 is disposed on the semiconductor layer 154 and the buffer layer 111, and may include a silicon oxide or a silicon nitride. A gate electrode 124 is disposed on the gate insulation layer 140 while overlapping the channel area 151 of the semiconductor layer 154.

An interlayer insulation layer 160 is disposed on the gate electrode 124 and the gate insulation layer 140. The interlayer insulation layer 160 includes a first contact hole 165 and a second contact hole 163.

A data conductor that includes a data line 171, a source electrode 173, and a drain electrode 175 is disposed on the interlayer insulation layer 160.

The drain electrode 175 is connected with the drain area 155 through the first contact hole 165. In addition, the source electrode 173 is connected with the source area 153 through the second contact hole 163.

A passivation layer 180 is disposed on the data conductor (171, 173, and 175) and the interlayer insulation layer 160, and includes a contact hole 185.

A first electrode 191 is disposed on the passivation layer 180. The first electrode 191 may be a pixel electrode. The first electrode 191 is connected with the drain electrode 175 through the contact hole 185. A barrier rib 361 is disposed on the passivation layer 180. A light emission element layer 370 is disposed while overlapping the first electrode 191, and a second electrode 270 is disposed to be overlapped with the light emission element layer 370. The second electrode 270 may be a common electrode.

In this case, the first electrode 191 may be an anode which is a hole injection electrode, and the second electrode 270 may be a cathode which is an electron injection electrode. However, the present invention is not limited thereto, and depending on a driving method of the display device, the first electrode 191 may be a cathode and the second electrode 270 may be an anode.

The light emission element layer 370 may include an emission layer, an electron transport layer, a hole transport layer, and the like.

An encapsulation layer 390 is disposed while overlapping the second electrode 270. The encapsulation layer 390 may include an organic material or an inorganic material, or an organic material and an inorganic layer that may be alternately stacked. The encapsulation layer 390 can protect the display device from an external environment, such as moisture, heat, and other contamination.

As described, in embodiments of the present invention, the resistors 500 are disposed at the outermost edges of the inspection pads 700 in the display device, and, thus, introduction of static electricity can be effectively blocked without causing a signal delay. In embodiments, since a fine line area is included in each inspection pad 700, the inspection pad 700 can function as a resistor, and introduction of static electricity can be effectively blocked and, accordingly, damage to the display device due to static electricity may be prevented or substantially prevented.

While the present invention has been described in connection with what are presently considered to be some practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A display device comprising:
   a substrate comprising a display area and a non-display area;
   a plurality of inspection pads in the non-display area; and
   a plurality of resistors, each located at an outermost edge of a respective inspection pad of the plurality of inspection pads,
   wherein each of the resistors is located at a distance from the display area, the respective inspection pad located between the resistor and the display area, and the resistor located at an outermost edge of the non-display area, and the respective inspection pad is not disposed between the resistor and the outermost edge of the non-display area, and
   wherein each of the plurality of inspection pads is exposed so as to be contactable by a probe to apply a signal to the display area.

2. The display device of claim 1, wherein a resistor of the plurality of resistors is located at each of the plurality of inspection pads.

3. The display device of claim 1, wherein the resistors comprise polysilicon.

4. The display device of claim 1, wherein a resistor of the plurality of resistors has a resistance of about 1 kΩ to about 4 kΩ.

5. The display device of claim 1, further comprising a flexible printed circuit board arranged in the non-display area,
- wherein the inspection pads are at opposite sides of the flexible printed circuit board.

6. The display device of claim 5, wherein the inspection pads are not connected with the flexible printed circuit board, and
- the inspection pads are connected with a data line and a gate line of the display area.

7. A display device comprising:
- a substrate comprising a display area and a non-display area; and
- a plurality of inspection pads in the non-display area,
- wherein each of the inspection pads comprises a first area and a second area,
- the second area is between the first area and the display area, and
- the first area has a higher resistance than the second area,
- wherein the first area directly contacts the second area, and
- wherein each of the plurality of inspection pads is exposed so as to be contactable by a probe to apply a signal to the display area.

8. The display device of claim 7, wherein the first area has a resistance of about 1 kΩ to about 4 kΩ.

9. The display device of claim 7, wherein an edge of the first area is located at an outermost edge of the non-display area.

10. A display device comprising:
- a substrate comprising a display area and a non-display area; and
- a plurality of inspection pads in the non-display area,
- wherein each of the plurality of inspection pads comprises a plurality of horizontal portions that are distanced from each other and vertical portions connecting the horizontal portions,
- the vertical portions are alternately arranged at opposite edges of the horizontal portions,
- the inspection pads include the horizontal portions and the vertical portions in an entire area of the inspection pads, and
- the inspection pads are disposed at an outermost edge of the non-display area.

11. The display device of claim 10, wherein the plurality of horizontal portions and the vertical portions of the inspection pad are connected as a single line, and are formed in a shape of a rectangular plane.

12. A display device comprising:
- a substrate comprising a display area and a non-display area; and
- a plurality of inspection pads in the non-display area,
- wherein each of the plurality of inspection pads comprises a through plate area and a minute line area,
- the minute line area comprises a plurality of horizontal portions that are distanced from each other and vertical portions connecting the horizontal portions, and
- the vertical portions are alternately arranged at opposite edges of the horizontal portions,
- wherein the through plate area is located between the minute line area and the display area.

13. The display device of claim 12, wherein a probe for signal application is configured to contact the through plate area.

14. The display device of claim 12, further comprising a plurality of resistors, each located at an edge of the minute line area, the resistor located at an outermost edge of a respective inspection pad of the plurality of inspection pads and at an outermost edge of the non-display area while being located at a distance from the display area, the respective inspection pad located between the resistor and the display area.

15. The display device of claim 14, wherein the resistors comprise polysilicon.

16. The display device of claim 14, wherein a resistor of the plurality of resistors has a resistance of about 1 kΩ to about 4 kΩ.

* * * * *